United States Patent [19]

Marino et al.

[11] Patent Number: 4,490,799

[45] Date of Patent: Dec. 25, 1984

[54] IGNITION COIL TEST APPARATUS

[75] Inventors: Joseph A. Marino, Waukesha; Michael J. Kling, Mequon, both of Wis.; Sydney J. Roth, Largo, Fla.; Surender K. Makhija, Milwaukee, Wis.

[73] Assignee: Bear Automotive Service Equipment Company, Milwaukee, Wis.

[21] Appl. No.: 327,733

[22] Filed: Dec. 4, 1981

[51] Int. Cl.[3] .................... G01M 15/00; G06F 15/20; G01R 29/02

[52] U.S. Cl. .................................. 364/551; 73/117.3; 324/388; 324/402

[58] Field of Search .................. 364/550, 551; 73/116, 73/117.3; 324/388, 402

[56] References Cited

U.S. PATENT DOCUMENTS

| | | | |
|---|---|---|---|
| 3,572,103 | 3/1971 | Marino | 73/116 |
| 3,573,608 | 4/1971 | Marino et al. | 73/117.3 |
| 3,630,076 | 12/1971 | Staudt | 73/117.3 |
| 3,788,129 | 1/1974 | Trussell | 73/116 |
| 3,940,977 | 3/1976 | Voross et al. | 73/116 |
| 4,008,434 | 2/1977 | Schaefer | 324/379 |
| 4,145,746 | 3/1979 | Trussell et al. | 364/551 |
| 4,291,383 | 9/1981 | Tedeschi et al. | 364/551 |

*Primary Examiner*—Felix D. Gruber

*Attorney, Agent, or Firm*—Kinney & Lange

[57] ABSTRACT

An ignition analyzer apparatus tests the condition of the ignition coil of an internal combustion engine. A gating pulse is supplied to a test circuit immediately before the points are to open for a selected cylinder which causes the test circuit to provide a low resistance in parallel with the points when the points open. This allows a reduced primary current to flow through the ignition coil and prevents the production of a voltage pulse large enough to fire the spark plug for the selected cylinder. While the points are open and the test circuit is providing a low resistance path, the primary current flowing through the coil is measured. The gating pulse ends approximately half-way between the "points open" time of the selected cylinder and the "points open" time of the next cylinder so that the rotor of the distributor is between distributor terminals. When the gating pulse ends, the test circuit changes to a nonconductive state, and since the points have not yet closed, the primary current is interrupted and a high voltage secondary test signal is induced in the secondary of the ignition coil. This test signal cannot, however, fire a spark plug since the rotor is in between distributor terminals, and since the reduced amplitude of the primary current prevents arc-over from the rotor to the distributor terminals. The measured primary current and the measured high voltage secondary test signal are used to provide an indication of ignition coil condition.

24 Claims, 9 Drawing Figures

IGNITION COIL TEST APPARATUS

CROSS-REFERENCE TO RELATED APPLICATIONS

Reference is hereby made to the following copending applications, which were filed on even date with the present application and are assigned to the same assignee as the present application: ENGINE ANALYZER WITH DIGITAL WAVEFORM DISPLAY, J. Marino, M. Kling, and S. Roth, Ser. No. 327,734; ENGINE ANALYZER WITH CONTANT WIDTH DIGITAL WAVEFORM DISPLAY, J. Marino, M. Kling and S. Roth, now U.S. Pat. No. 4,399,407 and ENGINE ANALYZER WITH SIMULATED ANALOG METER DISPLAY, M. Kling and J. Marino, Ser. No. 327,732.

BACKGROUND OF THE INVENTION

1. Field of the Invention

The present invention relates to engine analyzer apparatus used for testing internal combustion engines. In particular, the present invention relates to apparatus for measuring the condition of an ignition coil of an internal combustion engine.

2. Description of the Prior Art

A typical internal combustion engine used to power automobiles, trucks, and other land vehicles typically has several cylinders, and has an ignition system which includes a battery, an ignition coil, a condensor, a circuit interrupter (either breaker points or a solid state switching device), a distributor, and spark plugs for each of the cylinders. As the engine runs, the circuit interrupter periodically interrupts current flow through the primary winding of the ignition coil, thus inducing a high voltage output pulse which is supplied by the distributor to one of the spark plugs.

This type of ignition system requires periodic testing and maintenance in order to obtain the desired performance from the engine. It is necessary, on occasion, to determine whether the ignition coil is functioning properly and is providing the necessary output voltages to fire the various spark plugs. In the past, the testing of ignition coil condition has required the removal of a spark plug wire. This type of test, however, can be detrimental to the ignition system and dangerous to the person performing the test.

First, with improved components and materials used in modern vehicles, the length of time a spark plug wire is attached to a spark plug and the higher temperatures at which the engine is operating can cause the spark plug wire to become very difficult to remove without breaking. Second, since there is a tremendous amount of energy available in the secondary of the ignition system (especially in modern solid state ignition systems such as the General Motors HEI System), the opening of a spark plug wire may lead to a breakdown of the ignition voltage which may be damaging to the test equipment, or may cause carbon tracking in the distributor cap.

SUMMARY OF THE INVENTION

The present invention is an improved test system for determining the condition of an ignition coil in an internal combustion engine. With the apparatus of the present invention, the condition of the ignition coil can be determined while the engine is running, and without removing a spark plug wire or otherwise opening the secondary circuit of the ignition system.

The test apparatus of the present invention includes a test circuit which is connected across the circuit interrupter of the ignition system and which can be selectively actuated to provide a low resistance path in parallel with the circuit interrupter. When the condition of the ignition coil is to be tested, the test circuit is actuated to prevent the production of an output secondary voltage pulse and application of that pulse to a selected spark plug when the circuit interrupter switches from the conductive to the nonconductive state. When the rotor of the distributor is at a position at which the distributor cannot apply a generated secondary voltage to a spark plug, the test circuit then causes the ignition coil to generate a test secondary voltage signal.

The test apparatus includes means for measuring the test signal, as well as means for measuring the current flow through the primary winding of the ignition coil which generated that test voltage pulse. Based upon the sensed magnitude of the test signal, and the magnitude of the primary current, the test apparatus provides an output indicating the condition of the ignition coil being tested.

DETAILED DESCRIPTION OF THE PREFERRED EMBODIMENTS

Figure 1:
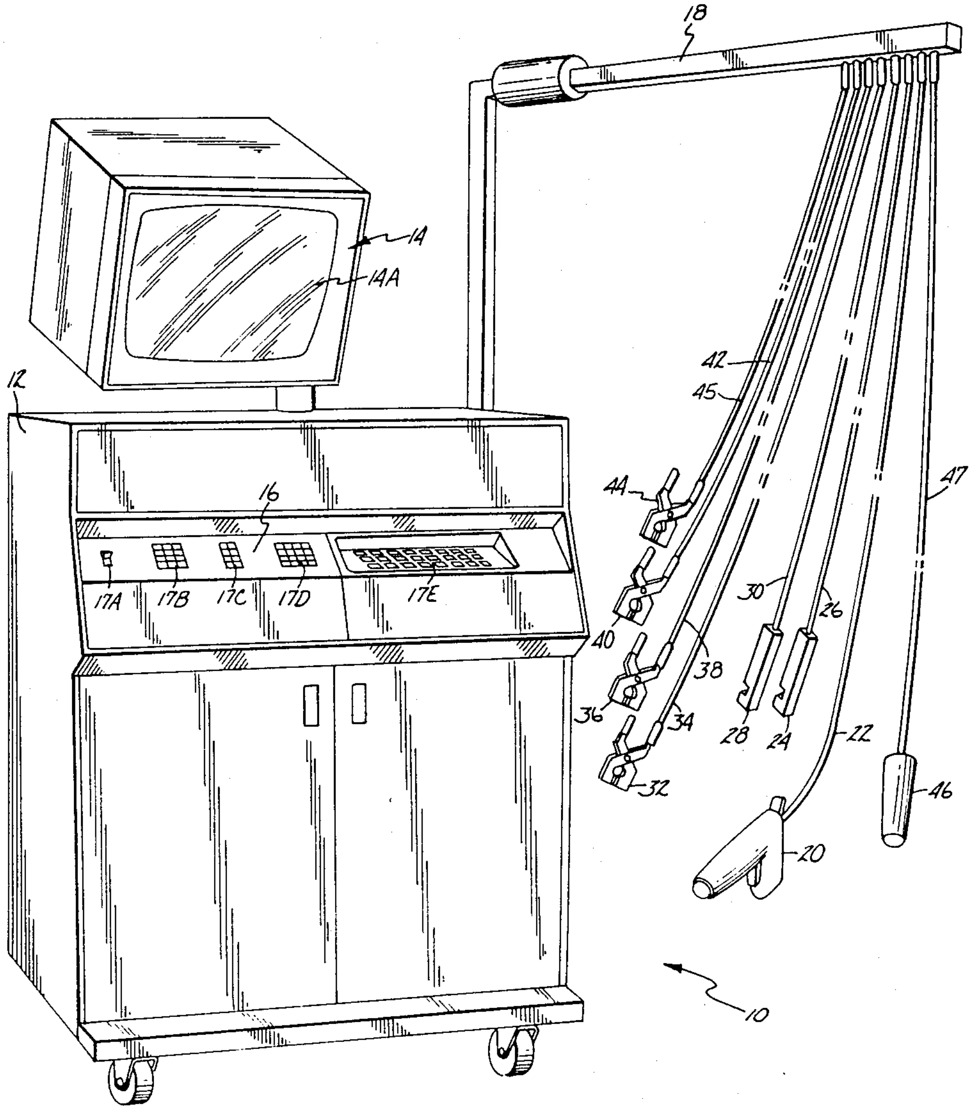
FIG. 1 is a perspective view showing an engine analyzer apparatus which utilizes the present invention.

In preferred embodiments of the present invention, the ignition coil test apparatus of the present invention is a part of a multi-function engine analyzer apparatus such as engine analyzer 10 shown in FIG. 1, which performs various ignition system tests. For that reason, the present invention will include some description of various devices and components which form a part of engine analyzer 10, although those devices and components do not form a part of the present invention.

As shown in FIG. 1, mounted at the front of housing 12 of analyzer 10 are cathode ray tube (CRT) raster scan display 14 and user interface 16, which is preferably a control panel having a plurality of control siwtches 17A–17D, as well as a keyboard 17E for entering numerical information. Extending from boom 18 are a plurality of cables which are electrically connected to the circuitry within housing 12, and which are intended for use during operation of the analyzer 10. Timing light 20 is connected at the end of multiconductor cable 22. "High Tension" (HT) probe 24 is connected at the end of multiconductor cable 26, and is used for sensing secondary voltage of the ignition system of an internal combustion engine of a vehicle (not shown). "No. 1" probe 28 is connected to the end of multiconductor cable 30, and is used to sense the electrical signal being supplied to the No. 1 sparkplug of the ignition system. "Engine Ground" connector 32, which is preferably an alligator-type clamp, is connected at the end of cable 34, and is typically connected to the ground terminal of the battery of the ignition system. "Points" connector 36, which is preferably an alligator-type clamp, is attached to the end of cable 38 and is intended to be connected to one of the primary winding terminals of an ignition coil of the ignition system. "Coil" connector 40, which is preferably an alligator-type clamp attached to the end of cable 42, is intended to be connected to the other primary winding terminal of the ignition coil. "Battery" connector 44, which is preferably an alligator-type clamp, is attached to the end of cable 45. Battery connector 44 is connected to the "hot" or "non-ground" terminal of the battery of the ignition system. Vacuum transducer 46 at the end of multiconductor cable 47 produces an electrical signal which is a linear function of vacuum or pressure, such as intake manifold vacuum or pressure.

Figure 2:
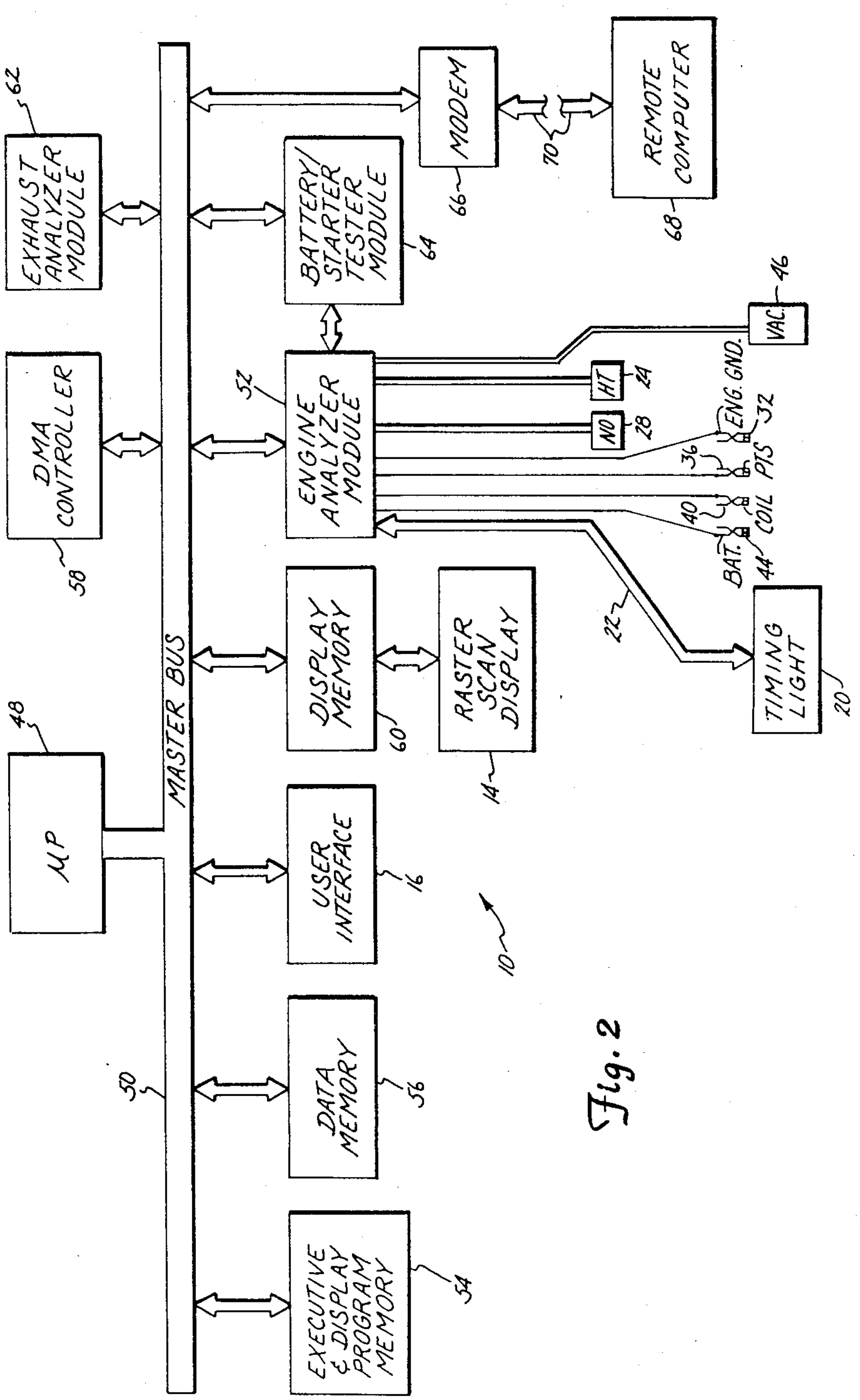
FIG. 2 is an electrical block diagram of the engine analyzer apparatus of FIG. 1.

FIG. 2 is an electrical block diagram showing engine analyzer 10 of the present invention. Operation of engine analyzer 10 is controlled by microprocessor 48, which communicates with the various subsystems of engine analyzer 10 by means of master bus 50. In the preferred embodiments of the present invention, master bus 50 is made up of fifty-six lines, which form a data bus, an address bus, a control bus, and a power bus.

Timing light 20, HT probe 24, No. 1 probe 28, Engine Ground connector 32, Points connector 36, Coil connector 40, Battery connector 44, and vacuum transducer 46 interface with the electrical system of engine analyzer 10 through engine analyzer module 52. As described in further detail later, engine analyzer module 52 includes a digital section and an analog section. Input signal processing is performed in the analog section, and the input analog signals received are converted to digital data. The digital section of engine analyzer module 52 interfaces with master bus 50.

Control of the engine analyzer system 10 by microprocessor 48 is based upon a stored program in engine analyzer module 52 and a stored program in executive and display program memory 54, (which interfaces with master bus 50). Digitized waveforms produced, for example, by engine analyzer module 52 are stored in data memory 56. The transfer of digitized waveforms from engine analyzer module 52 to data memory 56 is provided by direct memory access (DMA) controller 58. When engine analyzer module 52 provides a DMA Request signal on master bus 50, DMA controller 58 takes control of master bus 50 and transfers the digitized waveform data from engine analyzer module 52 directly to data memory 56. As soon as the data has been transferred, DMA controller 58 permits microprocessor 58 to again take control of master bus 50. As a result, the system of the present invention, as shown in FIG. 2, achieves storage of digitized waveforms in data memory 56 without requiring an inordinate amount of time of microprocessor 48 to accomplish the data transfer.

User interface 16 interfaces with master bus 50 and preferably includes swiches 17A–17D and a keyboard 17E through which the operator can enter data and select particular tests to be performed. For example, when the operator selects a particular waveform by means of user interface 16, microprocessor 48 retrieves the stored digitized waveform from data memory 56, converts the digitized waveform into the necessary digital display data to reproduce the waveform on raster scan display 14, and transfers that digital display data to display memory 60. As long as the digital display data is retained by display memory 60, raster scan display 14 continues to display the same waveform.

As further illustrated in FIG. 2, engine analyzer 10 has the capability of expansion to perform other engine test functions by adding other test modules. These modules can include, for example, exhaust analyzer module 62 and battery/starter tester module 64. Both modules 62 and 64 interface with the remaining system of analyzer 10 through master bus 50 and provide digital data or digitized waveforms based upon the particular tests performed by those modules. In the preferred embodiments shown in FIG. 2, modulator/demodulator (MODEM) 66 also interfaces with master bus 50, to permit analyzer 10 to interface with remote computer 68 through communication link 70. This is a particularly advantageous feature, since remote computer 68 typically has greater data storage and computational capabilities than are present within analyzer 10. Modem 66 permits digitized waveforms stored in data memory 56 to be transferred to remote computer 68 to further analysis, and also provides remote computer 68 to provide test parameters and other control information to microprocessor 48 for use in testing.

Figure 3:
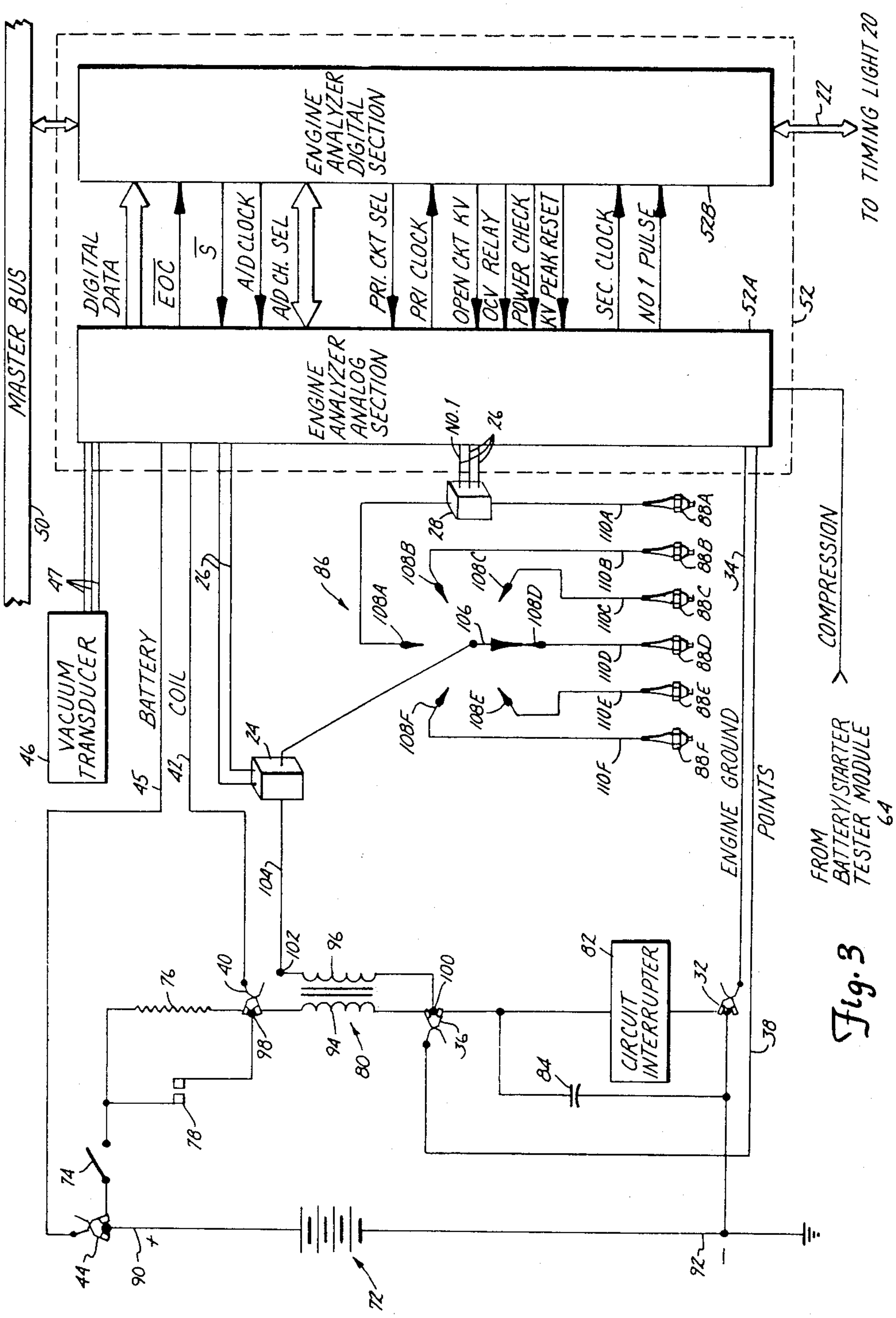
FIG. 3 shows the engine analyzer module of the apparatus of FIG. 2 in electrical schematic form in connection with a conventional ignition system of an internal combustion engine.

FIG. 3 shows engine analyzer 52 connected to a vehicle ignition system, which is schematically illustrated. The ignition system includes battery 72, ignition switch 74, ballast resistor 76, relay contacts 78, ignition coil 80, circuit interrupter 82, condensor 84, distributor 86, and igniters 88A–88F. The particular ignition system shown in FIG. 3 is for a six-cylinder internal combustion eingine. Engine analyzer 10 of the present invention may be used with a wide variety of different engines having different numbers of cylinders. The six-cylinder ignition system shown in FIG. 3 is strictly for the purpose of example.

In FIG. 3, battery 72 has its positive (+) terminal 90 connected to one terminal of ignition switch 74, and its negative (−) terminal 92 connected to engine ground. Ignition switch 74 is connected in a series current path with ballast resistor 76, primary winding 94 of ignition coil 80, and circuit interrupter 82 between positive terminal 90 and engine ground (i.e. negative terminal 92). Relay contacts 78 are connected in parallel with ballast resistor 76, and are normally open during operation of the engine. Relay contacts 78 are closed during starting of the engine by a relay coil associated with the starter/-cranking system (not shown) so as to short out ballast resistor 76 and thus reduce resistance in the series current path during starting of the engine.

Condensor 84 is connected in parallel with circuit interrupter 82, and is the conventional capacitor used in ignition systems. Circuit interrupter 82 is, for example, conventional breaker points operated by a cam associated with distributor 86, or is a solid state switching element in the case of solid state ignition systems now available in various automobiles. In subsequent discussion in this specification the term "points" is used as a label for certain signals and in describing the switching of circuit interrupter 82 to a non-conductive state (i.e. "points open") and the switching of circuit interrupter 82 to a conductive state (i.e. "points closed"). This usage of the term "points" is for convenience only and does not imply the particular construction of circuit interrupter 82.

As shown in FIG. 3, ignition coil 80 has three terminals 98, 100, and 102. Low voltage primary winding 94 is connected between terminals 98 and 100. Terminal 98 is connected to ballast register 76, while terminal 100 is connected to circuit interrupter 82. High voltage secondary winding 96 of ignition coil 80 is connected between terminal 100 and terminal 102. High tension wire 104 connects terminal 102 of coil 80 to distributor arm 106 of distributor 86. Distributor arm 106 is driven by the engine and sequentially makes contact with terminals 108A–108F of distributor 86. Wires 110A–110F connect terminals 108A–108F with igniters 88A–88F, respectively. Igniters 88A–88F normally take the form of conventional spark plugs. While igniters 88A–88F are shown in FIG. 3 as located in a continuous row, it will be understood that they are associated with the cylinders of the engine in such a manner as to produce the desired firing sequence. Upon rotation of distributor arm 106, voltage induced in secondary winding 96 of ignition coil 80 is successively applied to the various igniters 88A–88F in the desired firing sequence.

As shown in FIG. 3, engine analyzer 10 interfaces with the engine ignition system through engine analyzer module 52, which includes engine analyzer analog section 52A and engine analyzer digital section 52B. Input signals are derived from the ingition system by means of Engine Ground connector 32, Points connector 36, Coil connector 40, Battery connector 44, HT secondary voltage probe 24, and No. 1 probe 28. In addition, a vacuum/pressure electrical input signal is produced by vacuum transducer 46, and a COMPRESSION input signal (derived from starter current) is produced by battery/starter tester module 64. These input signals are received by engine analyzer analog section 52A and are converted to digital signals which are then supplied to engine analyzer digital section 52B. Communication between engine analyzer module 52 and microprocessor 48, data memory 56, and DMA controller 58 is provided by engine analyzer digital section 52B through master bus 50. In addition, engine analyzer digital section 52B interfaces with timing light 20 through cable 22.

As illustrated in FIG. 3, Engine Ground connector 32 is connected to negative terminal 92 of battery 72, or other suitable ground on the engine. Points connector 36 is connected to terminal 100 of ignition coil 80, which in turn is connected to circuit interrupter 82. As discussed previously, circuit interrupter 82 may be conventional breaker points or a solid state switching device of a solid state ignition system. Coil connector 40 is connected to terminal 98 of ignition coil 80, and Battery connector 44 is connected to positive terminal 90 of battery 72. All four connectors 32, 36, 40 and 44 are, therefore, connected to readily accessible terminals of the ignition system, and do not require removal of conductors in order to make connections to the ignition system.

HT probe 24 is a conventional probe used to sense secondary voltage in conductor 104. Similarly, No. 1 probe 28 is a conventional probe used to sense current flow through wire 110A. In the example shown in FIG. 3, igniter 88A has been designated as the igniter for the "No. 1" cylinder of the engine. Both probe 24 and probe 28 merely clamp around existing conductors, and thus do not require removal of conductors in order to make measurements.

Figure 4:
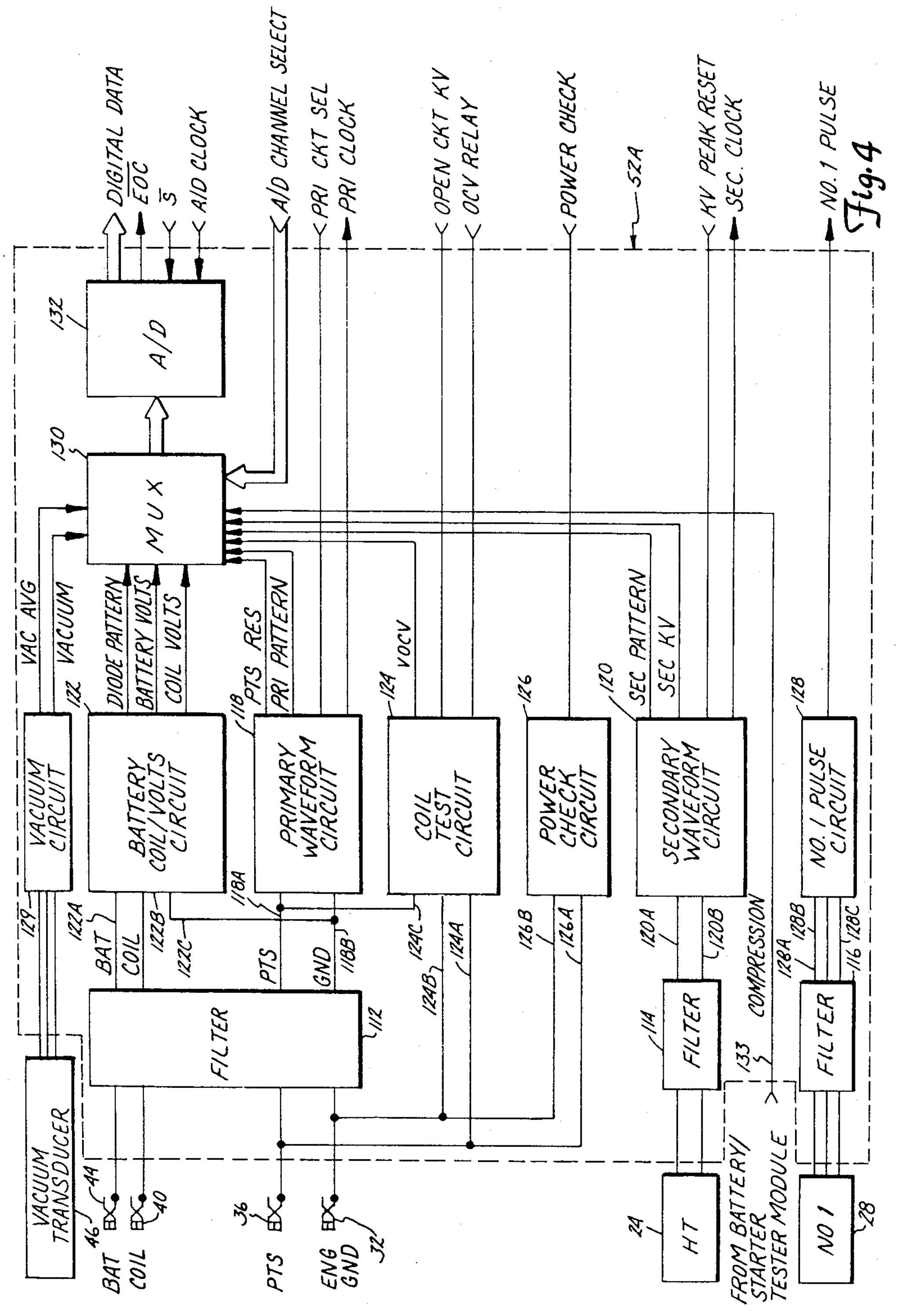
FIG. 4 is an electrical block diagram of the analog section of the engine analyzer module of FIG. 3.

FIG. 4 is an electrical block diagram showing engine analyzer analog section 52A, together with HT probe 24, No. 1 probe 28, Engine Ground connector 32, Points connector 36, Coil connector 40, Battery connector 44, and vacuum transducer 46. Analog section 52A includes input filters 112, 114, and 116, primary waveform circuit 118, secondary waveform circuit 120, battery coil/volts circuit 122, coil test circuit 124, power check circuit 126, No. 1 pulse circuit 128, vacuum circuit 129, multiplexer (MUX) 130, and analog-to-digital (A/D) converter 132. Analog section 52A supplies digital data, an end-of-conversion signal (EOC), a primary clock signal (PRI CLOCK), a secondary clock signal (SEC CLOCK), and a No. 1 PULSE signal to engine analyzer digital section 52B. Analog section 52A receives an S signal, an A/D CLOCK signal, A/D CHANNEL SELECT signals, a primary circuit select signal (PRI CKT SEL), a coil test gating signal (OPEN CKT KV), an OCV RELAY signal, a POWER CHECK signal and a KV PEAK RESET signal from engine analyzer digital section 52B.

For the purposes of the present invention, only secondary waveform circuit 120 and coil test circuit 124 are involved in testing ignition coil 80. A detailed description of the other circuitry of analog section 52A may be found in the previously mentioned U.S. Pat. No. 4,399,407 entitled "Engine Analyzer with Constant Width Digital Waveform Display".

The secondary voltage sensed by HT probe 24 is supplied through filter 114 to inputs 120A and 120B of secondary waveform circuit 120. The secondary voltage is reduced by a capacitive divider (not shown) by a factor of 10,000, is supplied through a protective circuit (not shown) which provides protection against intermittent high voltage spikes, and is introduced to three separate circuits (not shown). One circuit supplies the SEC CLOCK signal; a second circuit supplies a secondary pattern (SEC PATTERN) waveform to multiplexer 130, and a third circuit supplies the SEC KV signal to multiplexer 130.

The SEC CLOCK signal is a negative going signal which occurs once for each secondary ignition signal pulse, and has a duration of approximately 1 millisecond. The inverted secondary voltage signal is amplified and is used to drive two cascaded one-shot multivibrators (not shown). The SEC CLOCK signal occurs once for every secondary ignition signal and has a duration of approximately 1 millisecond.

The second circuit is a voltage follower circuit which derives the SEC PATTERN waveform from the inverted secondary voltage.

The third circuit within secondary waveform circuit 120 is a peak detector circuit in which the peak voltage value of the secondary voltage is stored and supplied as the SEC KV signal. The KV PEAK RESET signal supplied by digital section 52B is used to reset the SEC KV signal to zero, so that a new measurement of the peak secondary ignition signal can be made. As will be described later, this process is typically repeated, with the result being a series of peak pulse secondary KV values which correspond in value to the peaks of the secondary voltage waveform.

Coil test circuit 124 measures the condition of ignition coil 80 to determine if ignition coil 80 is in good condition. In the embodiment illustrated in FIG. 4, this is achieved without opening the circuit between terminal 102 of coil 80 and one of the igniters 88A–88F (shown in FIG. 3), as has been the typical practice in measuring ignition coil condition in the past. Opening the secondary circuit to measure coil condition can be detrimental to the ignition system, especially for ignition systems such as the General Motors HEI electronic ignition system. Since a tremendous amount of electrical energy is available in the secondary circuit of an ignition system, the opening of the secondary circuit, such as by removing a spark plug wire 110A–110F, may lead to the breakdown of the ignition voltage, which in turn may be damaging to the ignition system.

In order to avert this problem, coil test circuit 124 causes a secondary voltage measurement to be made at a reduced primary current value and to occur at a time when rotor 106 of distributor 86 is midway between two of the terminals 108A–108F of distributor 86 (e.g. between terminals 108A and 108B). Coil test circuit 124 has terminals 124A and 124B connected to Points connector 36 and Engine Ground connector 32, respectively, and has terminal 124C connected to the PTS output of filter 112. In addition, coil test circuit 124 receives the OPEN CKT KV and the OCV RELAY signals from digital section 52B, and provides an open circuit voltage signal ($V_{OCV}$) to multiplexer 30. The $V_{OCV}$ signal is indicative of the current flowing through primary winding 94 when circuit interrupter 82 is nonconductive and coil test circuit 124 is conductive.

Coil test circuit 124 causes the primary circuit path between terminal 90 and terminal 92 of battery 72 (FIG. 3) to open at a time when rotor 106 of distributor 86 is between terminals 108A and 108B and to produce a secondary KV signal at that time. The reduced energy in primary winding 94 of coil 80, and the fact that rotor 106 is not aligned with one of the terminals 108A–108F, which produces a large air gap in distributor 86, allows the secondary voltage sensed by HT probe 24 to reach a peak value without causing firing of one of the igniters 88A–88F. Microprocessor 48 requests a KV peak voltage (SEC KV) reading at a specific time through digital section 52B, which supplies the OPEN CKT KV signal to coil test circuit 124. Based upon the values of $V_{OCV}$ and SEC KV, microprocessor 48 determines the primary current flow through primary coil 94 which produced a given secondary voltage, and calculates a value of kilovolts per ampere (KV/ampere). By use of the OCV RELAY signal, microprocessor 48 performs the same test during two cycles of the engine with two different primary current values, and then selects the higher of the two KV/ampere test results. Ignition tests have determined that ignition coil 80 will exhibit at least a predetermined minimum value of KV/ampere if ignition coil 80 is in good condition. If the calculated value of KV/ampere falls below this predetermined minimum value, microprocessor 48 provides a message through raster scan display 14 indicating that ignition coil 80 requires replacement.

Figure 5:
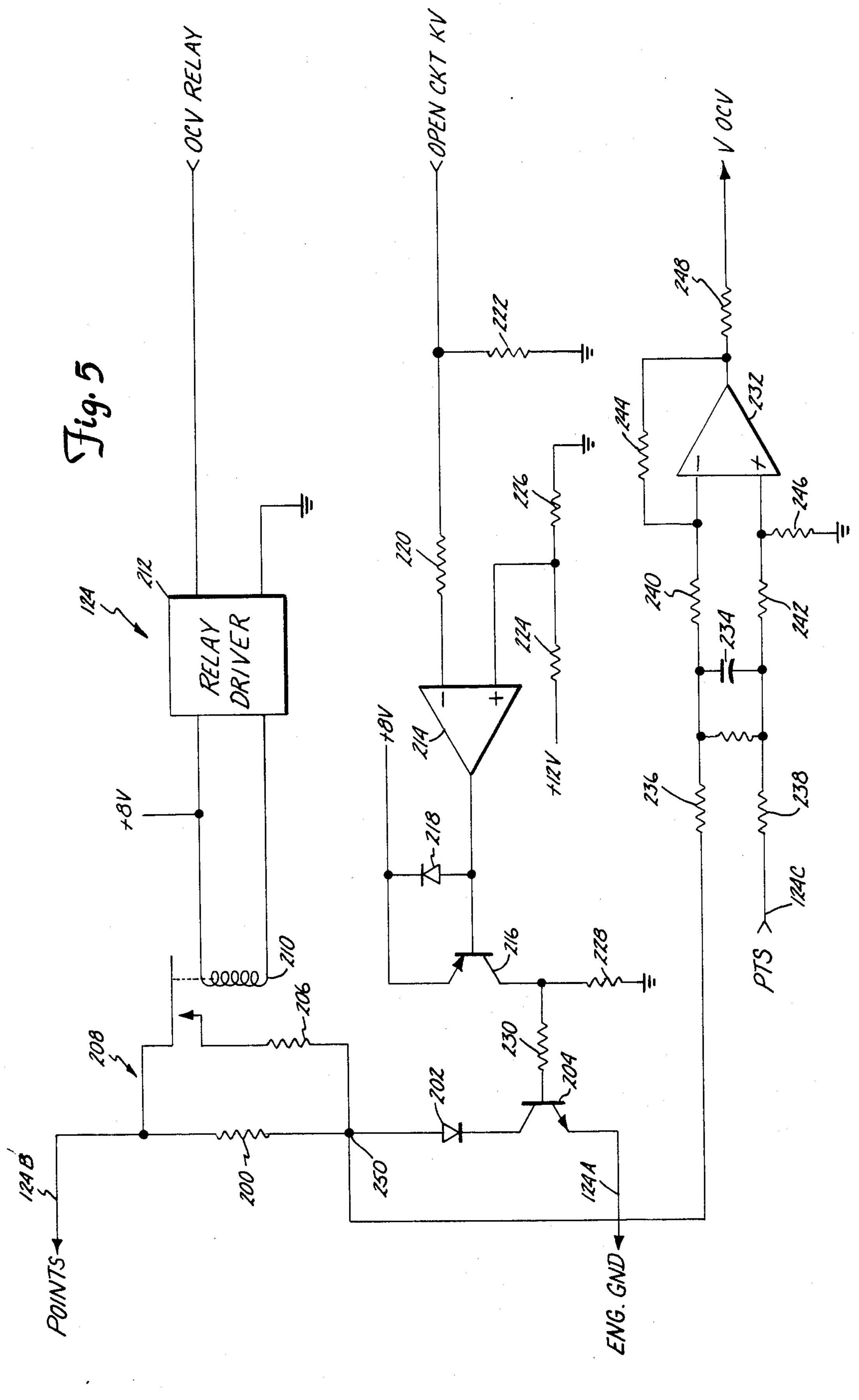
FIG. 5 is an electrical schematic diagram of the coil test circuit of the analog section of FIG. 4.

FIG. 5 shows coil test circuit 124 in further detail. Connected between terminals 124B and 124A of coil test circuit 124 is a current path including resistor 200, diode 202 and the collector-emitter current path of NPN transistor 204. Connected in parallel with resistor 200 are resistor 206 and relay contacts 208. When relay coil 210 is energized by relay driver 212, relay contacts 208 are closed, thus connecting resistor 206 in parallel with resistor 200. Relay driver 212 is controlled by the OCV RELAY signal from microprocessor 48 through digital section 52B. As a result, microprocessor 48 can control the effective resistance of the current path between terminals 124B and 124A to produce two different primary current values.

The conductive state of transistor 204 is controlled by microprocessor 48 by means of the OPEN CKT KV signal which is supplied to a drive circuit including amplifier 214, PNP transistor 216, diode 218 and resistors 220, 222, 224, 226, 228 and 230. The OPEN CKT KV signal is supplied to the inverting (−) input of amplifier 214, where it is compared with a reference signal derived from a voltage divider formed by resistors 224 and 226. When the OPEN CKT KV signal is low (i.e. less than the reference signal), the output of amplifier 214 is high, thus turning off PNP transistor 216, which in turn turns off NPN transistor 204. When the OPEN CKT KV signal goes high, (i.e. exceeds the reference signal), the output of amplifier 214 goes low, thus turning on transistors 216 and 204.

When transistor 204 is turned on, it provides a low resistance current path between terminals 124B and 124A. In the preferred embodiment of the present invention, resistors 200 and 206 each have a resistance of about 10 ohms. When transistor 204 is turned on, therefore, it effectively shunts or short-circuits circuit interrupter 82, if circuit interrupter 82 is in a nonconductive (i.e. "points open") state.

Coil test circuit 124 also includes a amplifier circuit which provides a voltage output $V_{OCV}$ which indicates the primary current flow between terminals 124B and 124A, and thus the primary current flowing through primary winding 94, when transistor 204 is turned on and circuit interrupter 82 is nonconductive. The measurement circuit includes amplifier 232, capacitor 234, and resistors 236, 238, 240, 242, 244, 246 and 248. Amplifier 232 compares a voltage derived from terminal 100 of coil 80 (which has been filtered by filter circuit 112 and supplied to input terminal 124C) and a signal derived from circuit node 250. In other words, the output voltage $V_{OCV}$ represents the voltage appearing across either resistor 200 or the parallel combination of resistors 200 and 206, depending on whether relay contacts 208 was closed. Voltage $V_{OCV}$, therefore, is indicative of the current flow through primary winding 94. Microprocessor 48 uses the value of $V_{OCV}$ and the resistance value used to obtain that value of $V_{OCV}$ and computes a primary current value. With this value and the SEC KV value from secondary waveform circuit 120, microprocessor 48 calculates a KV/ampere value which is indicative of the condition of ignition coil 80.

Figures 6A, 6B, 6C, 6D:
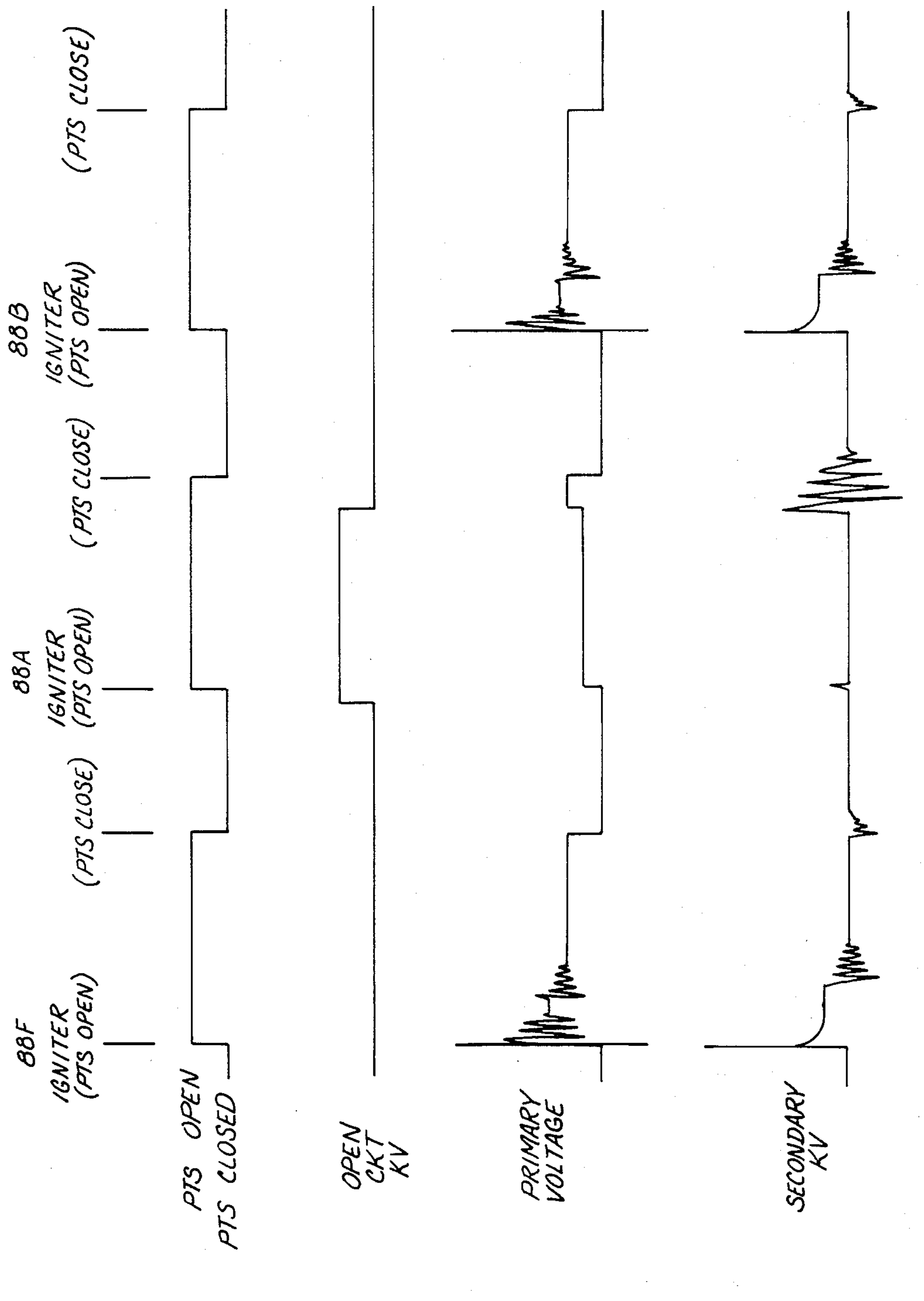
FIGS. 6A–6D are waveforms illustrating operation of the present invention.

FIGS. 6A–6D are waveforms which illustrate further the operation of the ignition coil test apparatus of the present invention. FIG. 6A shows the state of circuit interrupter 82, which as a conductive state and a nonconductive state. FIG. 6B shows the OPEN CKT KV gating signal which is supplied to coil test circuit 124 to selectively inhibit production of a secondary ignition pulse until distributor rotor 106 is between terminals (e.g. between terminals 108A and 108B). FIG. 6C shows primary voltage in primary winding 94 of ignition coil 80, and FIG. 6D shows the secondary KV signal induced in secondary winding 96, which is sensed by HT probe 24.

In the following discussion, it will be assumed that the "No. 1" cylinder and its spark plug (spark plug 88A) will be disabled when an ignition coil output test is to be performed. In other words, in this example production of a secondary voltage signal will be inhibited by coil test circuit 124 when rotor 106 is aligned with terminal 108A, and a secondary voltage test signal will be produced by operation of the coil test circuit when rotor 106 is approximately midway between terminals 108A and 108B. It should be understood, of course, that the selection of the particular cylinder to be disabled is made here solely for the purpose of example, and that the particular cylinder disabled can differ in practice.

When an operator selects the coil output test through user interface 16, microprocessor 48 first measures the period of the waveform for the preceding cylinder. In other words, the time duration from "points open" of the cylinder preceding the No. 1 cylinder to "points open" of the No. 1 cylinder is measured. This is preferably performed by a counter (not shown) contained within digital section 52B. This period measurement is based upon either the PRI CLK signal or the SEC CLK signal supplied by analog section 52A. Further description of the components and operation of digital section 52 (including the period measurement function) can be found in the previously mentioned, U.S. Pat. No. 4,399,407 entitled "Engine Analyzer with Constant Width Digital Waveform Display".

In addition, microprocessor 48 measures the time between "points open" and "points close" of the No. 1 cylinder. This, once again, is performed by a hardware counter within digital section 52B, based upon control signals from microprocessor 48.

Both period measurements are performed during cycles of the engine preceding the cycle during which the coil test is performed. Microprocessor 48 uses the period of the preceding cylinder to determine the time at which the open CKT KV gating signal goes high, and uses the measured time period between "points open" and "points close" of the No. 1 cylinder to determine when the open CKT KV signal should go low. Microprocessor 48 preferably sets a counter (not shown) within digital section 52B with a value slightly less than the time period of the preceding cylinder and enables that counter upon "points open" of the preceding cylinder. When the counter times out, microprocessor 48 causes the OPEN CKT KV gating signal to go high. This occurs, therefore, slightly before the normal "points open" of the No. 1 cylinder, as is illustrated in FIGS. 6A and 6B.

Microprocessor 48 also sets a counter (not shown) in digital section 52 with a value which is slightly less than the measured "points open" to "points close" period of the No. 1 cylinder. This counter is enabled when the OPEN CKT KV gating signal goes high and determines the duration of the OPEN CKT KV gating signal. As illustrated in FIGS. 6A and 6B, the open CKT KV signal preferably goes low before circuit interrupter 82 switches to a conductive state (i.e. "points close").

The resulting primary voltage and secondary KV signals are illustrated in FIGS. 6C and 6D. For igniter 88F, which is the igniter preceding No. 1 igniter 88A, the OPEN CKT KV gating signal is low when circuit interrupter 88 switches to a nonconductive state ("points open"). A primary voltage signal is generated, which induces a secondary KV signal capable of firing igniter 88F.

After circuit interrupter 82 has switched to its conductive state ("points close") and before it has again switched to its nonconductive state ("points open"), the OPEN CKT KV gating signal goes high, which causes coil test circuit 124 to provide a low resistance path between terminals 124B and 124A (i.e. across circuit interrupter 82). As a result, when circuit interrupter 82 switches to the nonconductive state, the primary voltage signal changes only slightly, and very little change in the secondary KV signal is produced. Ignitor 88A, therefore, is not fired.

When the OPEN CKT KV gating signal goes low, the current path between terminals 124B and 124A of coil test circuit 124 changes to a nonconductive state. Since circuit interrupter 82 is in a nonconductive state, a secondary KV test signal is generated. Since rotor 106 is approximately midway between terminals 108A and 108B, this secondary KV test signal is not supplied by distributor 86 to one of the igniters 88A–88F.

During the time when the OPEN CKT KV gating signal is high and circuit interrupter 82 is in a nonconductive state, microprocessor 48 measures the primary current by means of coil test circuit 124. The output voltage $V_{OCV}$ from coil test circuit 124 is representative of the primary current. The peak secondary voltage is measured by HT probe 24 and is processed by secondary waveform circuit 120 to produce the SEC KV signal. Based upon these two signals, and the known resistance used in the measurement of $V_{OCV}$, microprocessor 48 calculates a figure of merit value (KV/ampere).

The coil test is repeated during another cycle of the engine, with igniter 88A again being inhibited in the manner shown in FIGS. 6A–6D. During the second measurement, microprocessor 48 changes the resistance value used in measurement of voltage $V_{OCV}$ by means of the OCV relay signal. Based upon this second measured value of $V_{OCV}$ and the second measured value of the SEC KV signal, together with the known resistance used during the second measurement to produce the $V_{OCV}$ signal, microprocessor 48 again calculates the figure of merit (KV/ampere).

Microprocessor 48 then selects the larger of the two KV/ampere values, and compares that value to a predetermined stored minimum value, which is either preset in read-only memory within engine analyzer module 52 or is a value supplied through user interface 16 and stored by microprocessor 48 in data memory 56. If the larger of the two measured and calculated KV/ampere values does not exceed the predetermined minimum value, this indicates that ignition coil 80 is defective, and microprocessor 48 causes display 14 to display a message to the operator indicating that ignition coil 80 has failed the ignition coil test.

In conclusion, the coil test apparatus of the present invention provides a measurement of the condition of ignition coil 80 of an internal combustion engine without requiring removal of a spark plug wire or other opening of the secondary circuit of the ignition system. The test is performed completely automatically, and provides an indication to the operator of the condition of the ignition coil.

Although the present invention has been described with reference to preferred embodiments, workers skilled in the art will recognize that changes may be made in form and detail without departing from the spirit and scope of the invention.

What is claimed is:

1. An ignition coil test apparatus for a multicylinder internal combustion engine having an ignition circuit including an igniter for each cylinder, an ignition coil having a primary winding and a secondary winding, circuit interrupter means connected to the primary winding for periodically switching between a conductive and a nonconductive state to cause the ignition coil to generate a secondary voltage signal each time the circuit interrupter means is switched to the nonconductive state, and a distributor connected to the secondary winding for sequentially applying each generated secondary voltage signal to the igniter of a different cylinder in a predetermined sequence, the ignition coil test apparatus comprising:

test circuit means operatively connected across the circuit interrupter means to cause the circuit interrupter means to be effectively short-circuited each time the test circuit means is in a conductive state;

means for selectively causing the test circuit means to switch to its conductive state for a time interval beginning at a time when the circuit interrupter means is in its conductive state and ending at a time when the circuit interrupter means is in its nonconductive state and the distributor cannot apply secondary voltage to an igniter;

means for producing a first electrical signal which is a function of a secondary voltage generated in the secondary winding at the end of the time interval; and means for providing an indication of condition of the ignition coil as a function of the first electrical signal.

2. The ignition coil test apparatus of claim 2 and further comprising:

means for producing a second electrical signal which is a function of current flow through the test circuit means when the test circuit means is in its conductive state and the circuit interrupter means is in its nonconductive state; and wherein the means for providing an indication of condition of the ignition coil provides the indication as a function of the first and second electrical signals.

3. The ignition coil test apparatus of claim 2 wherein the means for providing an indication indicates that the ignition coil is defective if a ratio of the first and second electrical signals does not attain a predetermined value.

4. The ignition coil test apparatus of claim 1 wherein the means for selectively causing the test circuit means to switch selects the beginning and ending of the time interval so that a selected igniter is inhibited from receiving a generated secondary voltage based upon:

a first measured time period representing time from switching of the circuit interrupter means to its nonconductive state for an igniter preceding the selected igniter to switching of the circuit interrupter means to its nonconductive state for the selected igniter; and a second measured time period representing time from switching of the circuit interrupter means to its nonconductive state for the selected igniter to switching of the circuit interrupter means to its conductive state for the selected igniter.

5. The ignition coil test apparatus of claim 4 wherein the means for selectively causing the test circuit means to switch measures the first and second time periods, respectively, during a cycle of the engine prior to the cycle in which the gating signal is provided.

6. The ignition coil test apparatus of claim 1 wherein the test circuit means comprises:

switch means having a conductive state and a nonconductive state; and resistance means connected in series with the switch means to provide a low resistance current path across the circuit interrupter means when the switch means has its conductive state.

7. The ignition coil test apparatus of claim 6 wherein the resistance means has a plurality of selectable resistance values and further comprising means for selecting one of the selectable resistance values for the time interval.

8. The ignition coil test apparatus of claim 7 wherein the means for selectively causing the test circuit means to switch causes the test circuit means to switch for the time interval in each of a plurality of different cycles of the engine with each of the selectable resistance values.

9. The ignition coil test apparatus of claim 1 wherein the means for selectively causing the test circuit means to switch includes a digital computer.

10. An ignition coil test apparatus for a multicylinder internal combustion engine having an ignition circuit including an igniter for each cylinder, an ignition coil having a primary winding and a secondary winding connected in series with the primary winding, circuit interrupter means for periodically switching between a conductive and a nonconductive state, and a distributor including a rotor connected to the secondary winding and a plurality of terminals connected to the plurality of igniters for sequentially applying each generated secondary voltage to the igniter of a different cylinder in a predetermined sequence, the ignition coil test apparatus comprising:

test circuit means operatively connected across the circuit interrupter means to cause the circuit interrupter means to be effectively short-circuited each time the test circuit means is in a conductive state;

means for selectively causing the test circuit means to switch to its conductive state for a time interval beginning when the circuit interrupter means is in its conductive state and ending when the circuit interrupter means is in its nonconductive state and the rotor is approximately midway between a pair of the plurality of terminals; and means for providing an indication of condition of the ignition coil as a function of a secondary voltage generated in the secondary widing at the end of the time interval.

11. The ignition coil test apparatus of claim 10 and further comprising:

means for measuring current flow through the test circuit means when the test circuit means is in its conductive state and the circuit interrupter means is in its nonconductive state; and wherein means for providing an indication of condition of the ignition coil provides the indication as a function of the secondary voltage and the current flow.

12. The ignition coil test apparatus of claim 11 wherein the means for providing an indication indicates that the ignition coil is defective if a ratio of the secondary voltage and current flow does not attain a predetermined value.

13. The ignition coil test apparatus of claim 10 wherein the test circuit means switches state in response to a gating signal, and wherein the means for selectively causing the test circuit means to switch provides the gating signal to inhibit providing a secondary voltage to a selective igniter.

14. The ignition coil test apparatus of claim 13 wherein the means for selectively causing the test circuit means to switch provides the gating signal based upon a first time period representing time from switching of the circuit interrupter means to its nonconductive state for an igniter preceding the selected igniter to switching of the circuit interrupter means to its nonconductive state for the selected igniter; and a second time period representing time from switching of the circuit interrupter means to its nonconductive state for the selected igniter to switching of the circuit interrupter means to its conductive state for the selected igniter.

15. The ignition coil test apparatus of claim 14 wherein the means for selectively causing the test circuit means to switch measures the first and second time periods, respectively, during a cycle of the engine prior to a cycle in which the gating signal is provided.

16. The ignition coil test apparatus of claim 10 wherein the test circuit means comprises:

switch means having a conductive state and a nonconductive state; and resistance means connected in series with the switch means to provide a low resistance current path across the circuit interrupter means when the switch means has its conductive state.

17. The ignition coil test apparatus of claim 16 wherein the resistance means has a plurality of selectable resistance values and further comprising means for selecting one of the selectable resistance values for the time interval.

18. The ignition coil test apparatus of claim 17 wherein the means for selectively causing the test circuit means to switch causes the test circuit means to switch for the time interval in each of a plurality of different cycles of the engine with each of the selectable resistance values.

19. An ignition coil test apparatus for a multicylinder internal combustion engine having an ignition circuit including an igniter for each cylinder, an ignition coil having a primary winding and a secondary winding, circuit interrupter means connected in series with the primary winding for periodically switching between a conductive and a nonconductive state, and a distributor connected to the secondary winding for sequentially applying secondary voltage to the igniter of a different cylinder in a predetermined sequence, the ignition coil test apparatus comprising:

test circuit means operatively connected across the circuit interrupter means to cause the circuit interrupter means to be effectively short circuited each time the test circuit means is in a conductive state;

means for selectively causing the test circuit means to have its conductive state for a time interval beginning before the circuit interrupter means switches from its conductive to its nonconductive state and ending before the circuit interrupter means switches from its nonconductive state to its conductive state at a time when the distributor cannot apply a generated secondary voltage to an igniter;

means for measuring primary current during the time interval;

means for measuring secondary voltage generated at the ending of the time interval; and means for providing an indication of condition of the ignition coil based upon the measured primary current and the measured secondary voltage.

20. An ignition coil test apparatus for a multicylinder internal combustion engine having an ignition circuit including an igniter for each cylinder, an ignition coil having a primary winding and a secondary winding, circuit interrupter means connected in series with the primary winding for periodically switching between a conductive and a nonconductive state, and a distributor connected to the secondary winding for sequentially applying secondary voltage to the igniter of a different cylinder in a predetermined sequence, the ignition coil test apparatus comprising:

means for selectively connecting a short circuit current path across the circuit interrupter means for a time interval which begins at a time when the circuit interrupter means is in its conductive state and ends at a time when the circuit interrupter means is in its nonconductive state and the distributor cannot apply a generated secondary voltage to an igniter;

means for measuring secondary voltage generated at the ending of the time interval; and means for providing an indication of condition of the ignition coil based upon the measured secondary voltage.

21. The ignition coil test apparatus of claim 20 and further comprising:

means for measuring primary current during the time interval; and wherein the means for providing an indication of the condition of the ignition coil provides the indication based upon the measured primary current and the measured secondary voltage.

22. A method of determining condition of an ignition coil of a multicylinder internal combustion engine having an ignition circuit including an igniter for each cylinder, the ignition coil, a circuit interrupter which is periodically switched between a conductive and a nonconductive state, and a distributor for sequentially applying a secondary voltage generated in the ignition coil to the igniter of a different cylinder in a predetermined sequence, the method comprising:

connecting a short circuit current path in parallel with the circuit interrupter during a time interval which begins at a time when the circuit interrupter is in its conductive state and ends at a time when the circuit interrupter is in its nonconductive state and the distributor cannot apply a generated secondary voltage to an igniter;

measuring a primary current through the short circuit current path;

measuring a secondary voltage generated at the end of the time interval; and providing an indication of condition of the ignition coil as a function of the measured primary current and the measured secondary voltage.

23. The method of claim 22 wherein providing an indication of condition includes indicating that the ignition coil is defective if a ratio of the measured secondary voltage and primary current does not attain a predetermined value.

24. The method of claim 22 and further comprising:

measuring a first time period representing time from switching of the circuit interrupter to its nonconductive state for an igniter preceding a selected igniter to switching of the circuit interrupter means to its nonconductive state for the selected igniter;

measuring a second time period representing time from switching of the circuit interrupter to its nonconductive state for the selected igniter to switching of the circuit interrupter to its conductive state for the selected igniter; and beginning and ending of the time interval during a subsequent cycle of the engine based upon the measured first and second time periods so that the short circuit current path is connected in parallel with the circuit interrupter during the time interval to inhibit generation of a secondary voltage signal to the selected igniter.

* * * * *